(12) United States Patent
Hong (10) Patent No.: US 6,573,176 B2
(45) Date of Patent: Jun. 3, 2003

(54) METHOD FOR FORMING DUAL DAMASCENE LINE STRUCTURE

(75) Inventor: Eun Suk Hong, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/062,717

(22) Filed: Feb. 5, 2002

(65) Prior Publication Data

US 2003/0003715 A1 Jan. 2, 2003

(30) Foreign Application Priority Data

Jun. 27, 2001 (KR) .......................................... 01-36969

(51) Int. Cl.[7] .......................................... H01L 21/4763
(52) U.S. Cl. ...................... 438/637; 438/618; 438/622; 438/624; 438/638; 438/652; 438/717
(58) Field of Search ................................. 438/618, 620, 438/622, 624, 629, 636, 637, 638, 652, 672, 700, 639, 717, 942; 257/758, 760, 774

(56) References Cited

U.S. PATENT DOCUMENTS

| 5,990,015 A | | 11/1999 | Lin et al. | |
|---|---|---|---|---|
| 6,001,734 A | * | 12/1999 | Drynan ........................ | 438/637 |
| 6,004,883 A | | 12/1999 | Yu et al | |
| 6,071,809 A | | 6/2000 | Zhao . | |
| 6,077,769 A | | 6/2000 | Huang et al. | |
| 6,140,226 A | | 10/2000 | Grill et al. | |
| 6,365,506 B1 | * | 4/2002 | Chang et al. ................ | 438/624 |
| 6,376,366 B1 | * | 4/2002 | Lin et al. ..................... | 438/637 |
| 6,406,993 B1 | * | 6/2002 | Dakshina-Murthy et al. ........................... | 438/624 |
| 6,451,688 B1 | * | 9/2002 | Shimpuku .................... | 438/624 |
| 6,468,898 B1 | * | 10/2002 | Usami ......................... | 438/638 |
| 6,479,391 B2 | * | 12/2002 | Morrow et al. .............. | 438/706 |

* cited by examiner

*Primary Examiner*—Amir Zarabian
*Assistant Examiner*—Maria Guerrero
(74) *Attorney, Agent, or Firm*—Morgan, Lewis & Bockius LLP (57) ABSTRACT

A method of forming a dual damascene line structure suitable for forming a fine pattern is disclosed in the present invention. The method for forming a dual damascene line structure on a substrate includes sequentially depositing an inter-metal dielectric and a first hard mask over the substrate, partially removing the first hard mask to have a positive trench pattern using a first photoresist pattern as a mask, forming a second hard mask having a substantially different etch selectivity from the first hard mask on the partially removed portion of the first hard mask, selectively removing the first hard mask to have a negative via hole pattern using a second photoresist pattern as a mask, partially removing the inter-metal dielectric to have a via hole pattern using the first hard mask as a mask, and forming a trench and a via hole by removing the exposed first hard mask and selectively etching the inter-metal dielectric using the second hard mask.

17 Claims, 8 Drawing Sheets

METHOD FOR FORMING DUAL DAMASCENE LINE STRUCTURE

This application claims the benefit of Korean Application No. P2001-36969 filed on Jun. 27, 2001, which is hereby incorporated by reference.

BACKGROUND OF THE INVENTION

1. Field of the Invention

The present invention relates to a method for forming a semiconductor device, and more particularly, to a method for forming a dual damascene line structure. Although the present invention is suitable for a wide scope of applications, it is particularly suitable for forming a fine pattern in the semiconductor device.

2. Discussion of the Related Art

Various methods for forming a via hole and a trench have been introduced in the method for forming a dual damascene line structure.

A method for forming a via hole after forming a trench and a method for forming a trench after forming a via hole have been suggested as typical methods.

In such methods, a photoresist pattern is formed on the step portion where a via hole and a trench are formed therein. As a result, the photoresist pattern is often found deformed.

A related art method for forming a dual damascene line structure will now be described with reference to the accompanying drawings.

FIGS. 1A to 1D are cross-sectional views illustrating process steps of a related art method for forming a dual damascene line structures. FIGS. 2A to 2D are cross-sectional views illustrating another related art method for forming a dual damascene line structure.

In forming a dual damascene line structure, a via hole may be formed first after forming a trench. Althernatively, a trench may be formed first after forming a via hole.

Figure 1A:
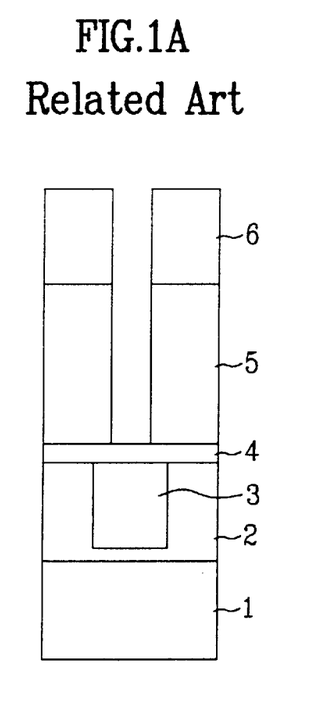
FIGS. 1A to 1D are cross-sectional views illustrating process steps of a related art method for forming a dual damascene line structure.

As shown in FIG. 1A, the method for forming a dual damascene line structure includes selectively etching an insulating layer 2 on a semiconductor substrate 1 to form a trench, burying a metallic layer inside the trench and planarizing the metallic layer to form a lower metallic line 3.

Subsequently, a diffusion barrier layer 4 is deposited on the lower metallic line 3. A low dielectric layer is then deposited on the diffusion barrier layer 4 to form an intermetal dielectric IMD 5.

Then, after depositing a photoresist on the IMD 5, a photoresist pattern 6 having a via hole pattern is formed by exposure and developing processes so that a portion of the IMD 5 is exposed.

In this case, the photoresist pattern 6 is formed thick enough for forming a deep via hole within the IMD 5 in a later process. Alternatively, the IMD 5 is formed to have a higher etch selectivity than that of the photoresist pattern 6.

Using the photoresist pattern 6 as a mask, the IMD 5 is etched by a plasma dry etching process to form a via hole therein.

Figure 1B:
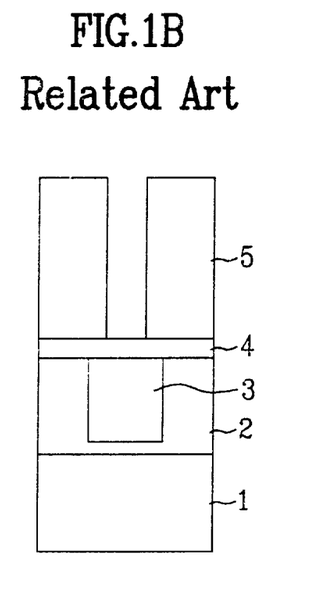

As shown in FIG. 1B, after removing the photoresist pattern 6, a polymer remaining within the via hole is removed by a cleaning process.

Figure 1C:
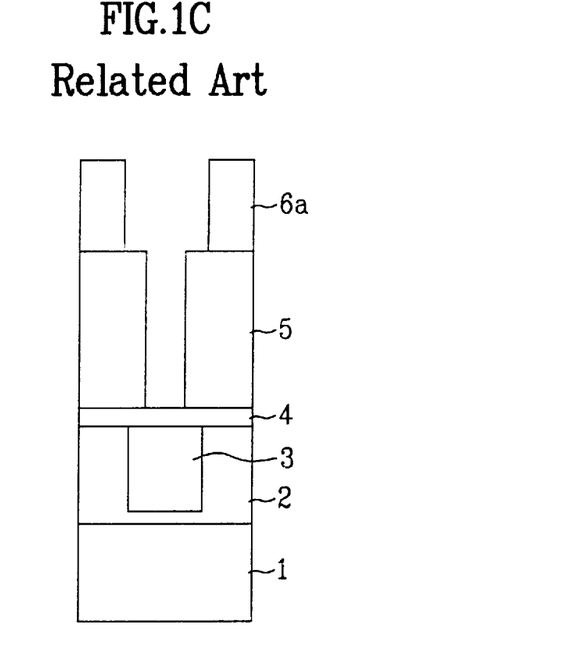

In addition, as shown in FIG. 1C, after depositing a photoresist on the IMD 5, the IMD 5 is negatively patterned to expose a portion of the IMD 5, thereby forming a photoresist pattern 6a having a trench pattern.

Figure 1D:
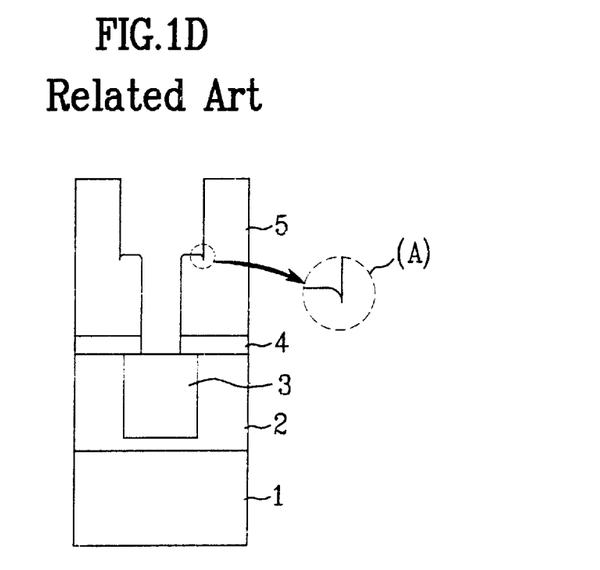

Subsequently, as shown in FIG. 1D, using the photoresist pattern 6a as a mask, the IMD 5 is selectively etched to form a trench.

In this case, a micro-trench shown as portion 'A' is formed inside the trench during the etching process.

Additionally, after depositing a metallic material such as tungsten, which is thick enough to completely bury the via hole and the trench, the metallic material is planarized by a chemical mechanical polishing (CMP) process. Thus, an upper surface of the IMD 5 is exposed, thereby forming a plug (not shown) and an upper metallic line (not shown).

The process of the aforementioned related art method for forming a dual damascene line structure is simple and has an advantage of preventing an increase in a dielectric constant of the IMD 5 through the diffusion barrier layer 4. However, the aforementioned method has a disadvantage in that, in order to form a deep via hole, the photoresist pattern 6 should be thick enough or the IMD 5 should have a higher etch selectivity than that of the photoresist pattern 6.

In addition, removing the polymer that remains within the via hole is difficult, and a micro-trench may be formed in forming the trench.

Figure 2A:
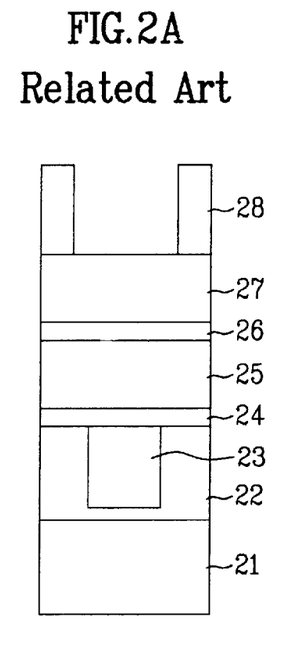
FIGS. 2A to 2D are cross-sectional views illustrating process steps of another related art method for forming a dual damascene line structure.

In FIG. 2A, another related art method of forming a dual damascene line structure includes sequentially depositing a diffusion barrier layer 24, a first IMD 25, an etching stop layer 26, and a second IMD 27 on a semiconductor substrate 21 including a lower metallic line 23 formed within an insulating layer 22.

Then, after depositing a photoresist on the second IMD 27, a photoresist pattern 28 having a trench pattern is formed by exposure and development processes so that a portion of the second IMD 27 is exposed.

Figure 2B:
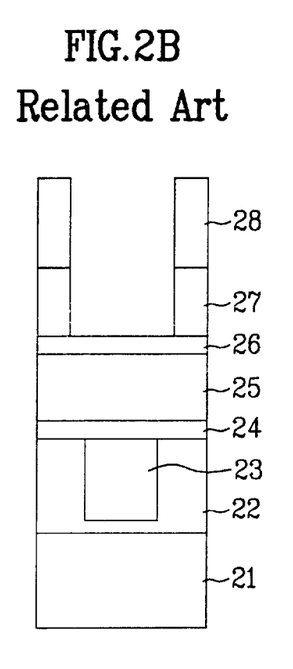

As shown in FIG. 2B, using the photoresist pattern 28 as a mask, the second IMD 27 is etched by a plasma dry etching process exposing a portion of the etching stop layer 26 so as to form a trench.

Figure 2C:
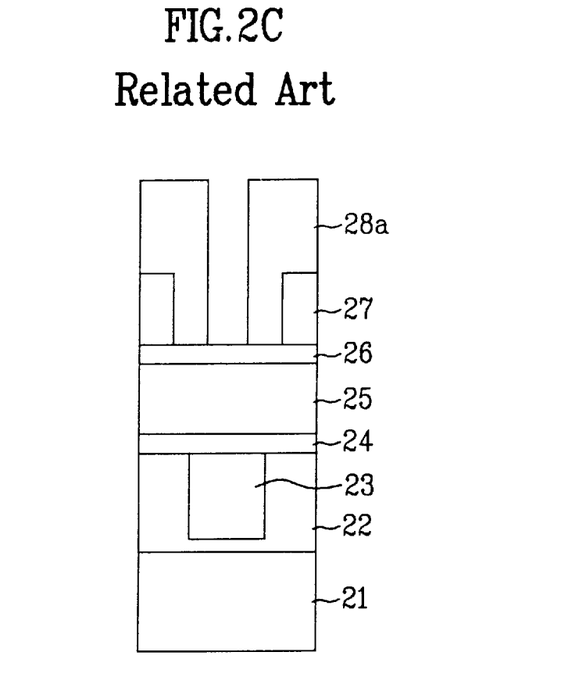

In addition, as shown in FIG. 2C, the photoresist pattern 28 having a trench pattern is removed. A photoresist is once again deposited on the entire surface. Then, the photoresist is patterned by a negative patterning process to expose a portion of the etching stop layer so as to form a photoresist pattern 28a having a via hole pattern.

Figure 2D:
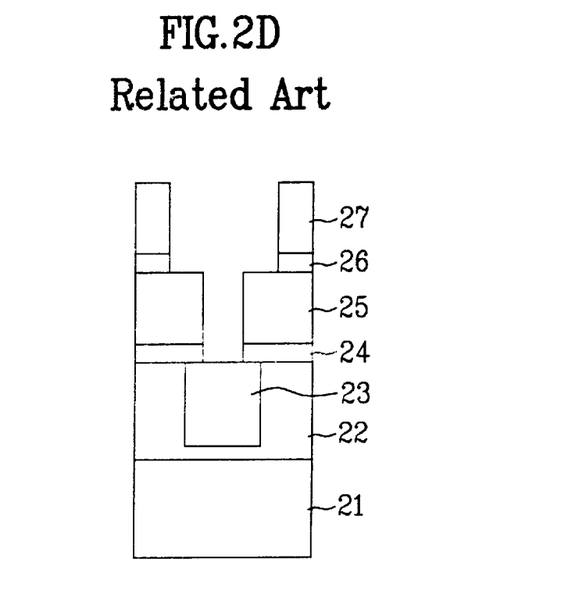

Subsequently, as shown in FIG. 2D, using the photoresist pattern 28a as a mask, the etching stop layer 26, the first IMD 25, and the diffusion barrier layer 24 are selectively etched exposing a portion of a lower metallic line so as to form a via hole.

Then, after depositing a metallic material such as tungsten, which is thick enough to completely bury the via hole and the trench, the metallic material is polished by a CMP process exposing an upper surface of the second IMD 27 to form a plug (not shown) and an upper metallic line (not shown).

The process of the aforementioned related art method of forming a dual damascene line structure has an advantage of controlling the depth and profile of etching during the trench etching and the via hole etching processes. However, the aforementioned method has a difficulty in controlling the width of the via hole when forming the photoresist pattern for a via hole etching process and an increase in dielectric constant of the IMDs due to the etching stop layer.

As discussed above, the two related art methods for forming a dual damascene line structure have the following problems. When etching a via hole and a trench by using a photoresist pattern as a mask for etching an IMD, it is difficult to form a fine pattern due to the thickness of the photoresist pattern.

This not only results in a difficulty in accurately controlling the size of the trench or the via hole, but also results in a plurality of polymers produced during the etching process of the IMDs.

SUMMARY OF THE INVENTION

Accordingly, the present invention is directed to a method for a forming dual damascene line structure that substantially obviates one or more of problems due to limitations and disadvantages of the related art.

Another object of the present invention is to provide a method for a forming dual damascene line structure capable of forming a fine pattern, by using two(2) metallic hard masks with completely different etching methods to form a via hole and a trench.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming a dual damascene line structure on a substrate includes sequentially depositing an inter-metal dielectric and a first hard mask over the substrate, partially removing the first hard mask to have a positive trench pattern using a first photoresist pattern as a mask, forming a second hard mask having a substantially different etch selectivity from the first hard mask on the partially removed portion of the first hard mask, selectively removing the first hard mask to have a negative via hole pattern using a second photoresist pattern as a mask, partially removing the inter-metal dielectric to have a via hole pattern using the first hard mask as a mask, and forming a trench and a via hole by removing the exposed first hard mask and selectively etching the inter-metal dielectric using the second hard mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

FIGS. 3A to 3D are cross-sectional views illustrating process steps of a method for forming a dual damascene line structure according to the present invention.

Figure 3A:
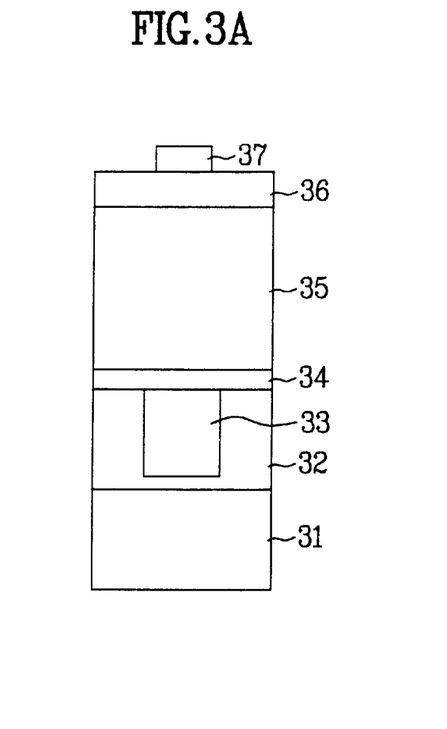
FIGS. 3A to 3H are cross-sectional views illustrating process steps of a method for forming a dual damascene line structure according to the present invention.

As shown in FIG. 3A, a trench for forming a lower metallic line 33 is formed within an insulating layer on a semiconductor substrate 31 by a damascene method. In this embodiment, a metallic material is buried within the trench for forming a lower metallic line to form a lower metallic line 33.

Subsequently, silicon nitride having a low dielectric constant is deposited on the lower metallic line 33 to form a diffusion barrier layer 34. A low IMD material is further deposited on the diffusion barrier layer 34 to form an IMD 35.

The IMD 35 becomes an insulating layer for the lower metallic line 33 and an upper metallic line, which will be formed in a later process.

In addition, a metallic material is deposited on the IMD 35 to form a first hard mask 36. A hard mask has different etch characteristics from an underlying dielectric. Also, the hard mask is more resistant than photoresist to the etching conditions used for the photoresist pattern into the underlying dielectric.

A material easily etched by a plasma including an activated $Cl_2+BCl_3+N_2$ gas may be used as the first hard mask 36. For example, one of Ti, TiN, Ta, and TaN may be chosen for the first hard mask 36.

Additionally, after depositing a photoresist on the first hard mask 36, a first photoresist pattern 37 having a positive trench pattern is formed by exposure and developing processes so that a portion of the first hard mask 36 is exposed.

In this case, the first photoresist pattern 37 is formed to have a minimum thickness in order to partially etch the first hard mask 36.

The first photoresist pattern 37 formed having a minimum thickness and the flat first hard mask 36, are advantageous not only in forming a fine pattern but also in accurately forming a critical dimension of the pattern.

Figure 3B:
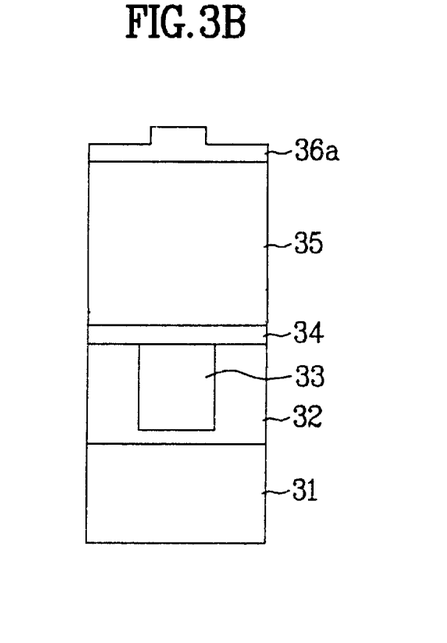

Moreover, as shown in FIG. 3B, by using the first photoresist pattern 37 having a positive trench pattern as a mask, a portion of the first hard mask 36 is partially removed.

In this case, the etching process is performed by using a plasma including an activated $Cl_2+BCl_3+N_2$ gas to partially etch a portion of the first hard mask 36 that is not protected by the first photoresist pattern 37.

By using the aforementioned process, tungsten can be deposited on a first hard mask 36a, one of a Ti or Ta based material. This is because that tungsten, which is used as a material for a second hard mask 38, cannot be directly formed on the IMD 35.

In addition, because the first photoresist pattern has a positive trench pattern, the first hard mask 36a also has a positive trench pattern.

Figure 3C:
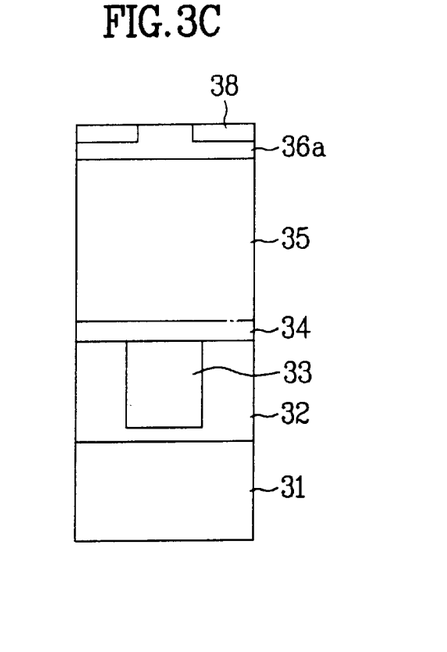

As shown in FIG. 3C, after removing the first photoresist pattern 37, tungsten is deposited on the entire surface of the first hard mask 36a and then, planarized by a CMP process exposing the surface of the first hard mask 36a so as to form a second hard mask 38.

In this case, the second hard mask 38 has a negative metallic line pattern due to a positive patterning of the first hard mask 36a.

Therefore, instead of using a damascene reticle, any reticle can be used to form a damascene pattern.

Figure 3D:
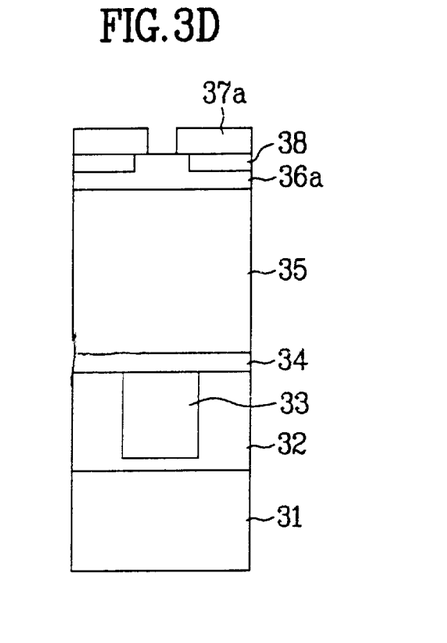

Furthermore, as shown in FIG. 3D, after depositing a photoresist on the first hard mask 36a and the second hard mask 38, a second photoresist pattern 37a having a negative via hole pattern is formed on the first hard mask 36a by exposure and development processes. A portion of the first hard mask 36a is exposed.

In this case, the second photoresist pattern 37a is formed to have a minimum thickness in order to etch the first hard mask 36a only.

Therefore, with the second photoresist pattern 37a having a thin thickness and the first hard mask 36a and the flat second hard mask 38 due to a CMP process, a fine pattern is easily formed and a critical dimension of the pattern can be accurately formed.

Figure 3E:
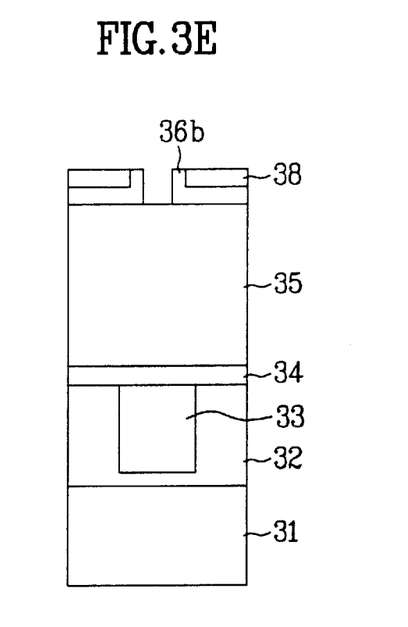

Furthermore, as shown in FIG. 3E, by using the second photoresist pattern 37a as a mask, the first hard mask 36a is selectively etched.

In this case, the etching process uses a plasma including an activated $Cl_2+BCl_3+N_2$ gas for etching the first hard mask 36a until the IMD 35 is exposed to form a via hole pattern.

Figure 3F:
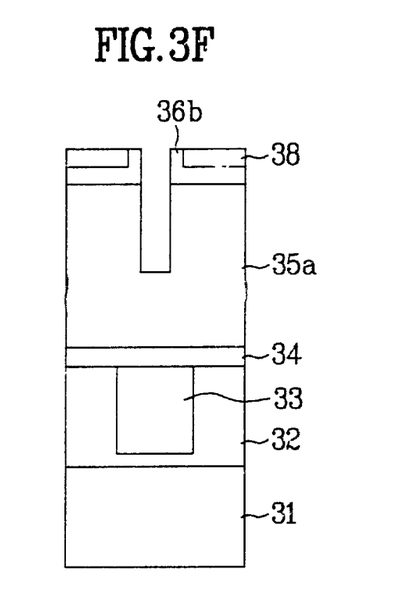

In addition, as shown in FIG. 3F, after removing the second photoresist pattern 37a, by using the first hard mask 36b having a via hole pattern and the second hard mask 38 as masks, an IMD 35 is selectively etched to form a via hole pattern within the IMD 35a.

In this case, the via hole formed within the IMD 35a is formed by an etching process using a plasma including an activted gas of $C_aF_b+C_xH_yF_z+Ar$ (wherein a, b, x, y, and z are integers), which has a higher etch selectivity than the first hard mask 36b.

Additionally, the via hole pattern is etched to have good anisotropic characteristic and a minimum change in its cross-section instead of having a bowing shape whereby the cross-section is frequently changed as etching becomes deeper. Also, because the etching process of the IMD 35a is carried out without using a photoresist, less metallic polymer is produced during the process.

Figure 3G:
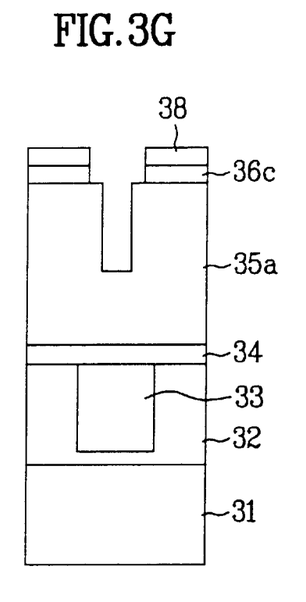

As shown in FIG. 3G, using a second hard mask 38 as a mask, the exposed portion of the first hard mask 36b is removed.

In this case, the first hard mask 36b is selectively etched by using a plasma activated by a $Cl_2+BCl_3+N_2$ gas. In the aforementioned etching process, an etch selectivity of tungsten and oxide is extremely low. Therefore, the second hard mask 38 and the IMD 35a are hardly etched and only an exposed portion of the first hard mask 36b is removed.

Figure 3H:
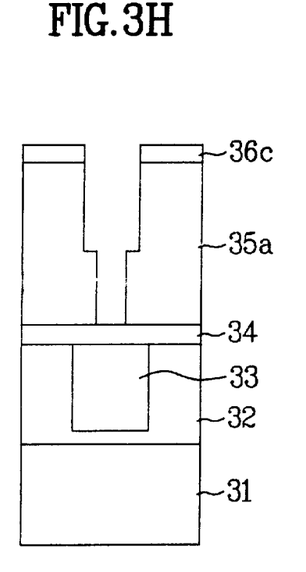

Furthermore, as shown in FIG. 3H, using the second hard mask 38, the IMD 35a having via hole pattern is selectively etched to form a via hole and a trench at the same time. The via hole and the trench penetrate the IMD 35a and reach a lower metallic line 33.

In this case, the IMD 35a is etched by using a plasma activated by a $C_aF_b+C_xH_yF_z+Ar$ gas (wherein a, b, x, y, and z are integers), and through this etching process the second hard mask 38 is removed.

Subsequently, after removing the first hard mask 36c, a metallic material thick enough to completely bury the via hole and the trench is deposited and planarized by a CMP process, so that the upper surface of the IMD 35b is exposed, thereby forming a plug (not shown) and an upper metallic line (not shown) therein.

The aforementioned method for forming a dual damascene line structure according to the present invention has the following advantages.

By reducing a thickness of the photoresist for patterning a hard mask and by patterning the photoresist on a completely flat hard mask, a fine pattern is obtained in the present invention. This facilitates the control of the size in the via hole or the trench and enables to achieve an accurate critical dimension.

In addition, the etching process of the IMD is carried out without using a photoresist. Therefore, the amount of polymer produced during the process is significantly reduced.

It will be apparent to those skilled in the art that various modifications and variations can be made in the method for forming a dual damascene line structure of the present invention without departing from the spirit or scope of the inventions. Thus, it is intended that the present invention covers the modifications and variations of this invention provided they come within the scope of the appended claims and their equivalents.

What is claimed is:

1. A method for forming a dual damascene line structure on a substrate, comprising:
    sequentially depositing an inter-metal dielectric and a first hard mask over the substrate;
    partially removing the first hard mask to have a positive trench pattern using a first photoresist pattern as a mask;
    forming a second hard mask having a substantially different etch selectivity from the first hard mask on the partially removed portion of the first hard mask;
    selectively removing the first hard mask to have a negative via hole pattern using a second photoresist pattern as a mask;
    partially removing the inter-metal dielectric to have a via hole pattern using the-first hard mask as a mask; and
    forming a trench and a via hole by removing the exposed first hard mask and selectively etching the inter-metal dielectric using the second hard mask.

2. The method of claim 1, wherein the inter-metal dielectric is formed of a low inter-metal dielectric material.

3. The method of claim 1, wherein the first hard mask is formed of one of Ti, TiN, Ta, and TaN.

4. The method of claim 1, wherein the second hard mask is formed of tungsten.

5. The method of claim 1, wherein the second hard mask is formed to have a metallic line having a negative pattern.

6. The method of claim 1, wherein the inter-metal dielectric is etched by using a plasma including an activated $C_aF_b+C_xH_yF_z+Ar$ gas (wherein a, b, x, y, and z are integers).

7. The method of claim 1, wherein the first photoresist pattern has a positive trench pattern.

8. The method of claim 1, wherein the first photoresist pattern has a thickness thin enough to partially etch the first hard mask.

9. The method of claim 1, wherein the second photoresist pattern has a negative via hole pattern.

10. The method according to claim 1, wherein the second photoresist pattern has a thickness thin enough to etch the first hard mask only.

11. The method according to claim 1, further comprising planarizing a second hard mask, by using a chemical mechanical polishing (CMP) process after being deposited on the first hard mask.

12. The method according to claim 1, further comprising removing remaining portions of the first and second hard masks after forming the via hole and the trench.

13. The method according to claim 1, further comprising depositing a metallic material within the via hole and the trench to form a plug and an upper metallic line.

14. The method of claim 1, further comprising a lower metallic line formed within the inter-metal dielectric.

15. The method of claim 1, wherein the first hard mask is etched by using a plasma etching process.

16. The method of claim 14, further comprising a diffusion barrier layer on the lower metallic line including the inter-metal dielectric.

17. The method of claim 15, wherein the plasma includes a $Cl_2+BCl_3+N_2$ gas.

* * * * *